(12) United States Patent
Mowry et al.

(10) Patent No.: US 8,564,120 B2
(45) Date of Patent: Oct. 22, 2013

(54) HEAT DISSIPATION IN TEMPERATURE CRITICAL DEVICE AREAS OF SEMICONDUCTOR DEVICES BY HEAT PIPES CONNECTING TO THE SUBSTRATE BACKSIDE

(75) Inventors: Anthony Mowry, Buda, TX (US); David Farber, Austin, TX (US); Fred Hause, Austin, TX (US); Markus Lenski, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 124 days.

(21) Appl. No.: 12/642,989

(22) Filed: Dec. 21, 2009

(65) Prior Publication Data

US 2010/0164093 A1 Jul. 1, 2010

(30) Foreign Application Priority Data

Dec. 31, 2008 (DE) .................. 10 2008 063 416

(51) Int. Cl.
*H01L 23/36* (2006.01)
*H01L 21/00* (2006.01)

(52) U.S. Cl.
USPC ........... 257/706; 257/714; 257/717; 257/720; 257/E23.08; 257/E23.088; 257/E23.101; 438/122

(58) Field of Classification Search
USPC .............. 257/706, 714, 717, 720, E23.08, 257/E23.088, E23.101; 438/122
See application file for complete search history.

(56) References Cited

U.S. PATENT DOCUMENTS

| | | | | |
|---|---|---|---|---|
| 5,276,338 A * | 1/1994 | Beyer et al. | | 257/52 |
| 5,463,241 A | 10/1995 | Kubo | | 257/376 |
| 6,190,985 B1 * | 2/2001 | Buynoski | | 438/311 |
| 6,333,557 B1 * | 12/2001 | Sullivan | | 257/758 |
| 6,483,147 B1 * | 11/2002 | Lin | | 257/347 |
| 7,052,937 B2 * | 5/2006 | Clevenger et al. | | 438/122 |
| 7,119,431 B1 | 10/2006 | Hopper et al. | | 257/706 |
| 2003/0017650 A1 * | 1/2003 | Armbrust et al. | | 438/122 |
| 2004/0222528 A1 * | 11/2004 | Kunikiyo | | 257/758 |
| 2005/0127397 A1 * | 6/2005 | Borges et al. | | 257/189 |
| 2007/0001289 A1 * | 1/2007 | Takao | | 257/705 |
| 2008/0029883 A1 * | 2/2008 | Sung | | 257/720 |
| 2008/0224257 A1 * | 9/2008 | Mori | | 257/507 |

OTHER PUBLICATIONS

Translation of Official Communication from German Patent Office for German Patent Application No. 10 2008 063 416.6 dated Oct. 30, 2009.

* cited by examiner

*Primary Examiner* — Peniel M Gumedzoe
(74) *Attorney, Agent, or Firm* — Williams, Morgan & Amerson, P.C.

(57) ABSTRACT

By providing heat dissipation elements or heat pipes in temperature critical areas of a semiconductor device, enhanced performance, reliability and packing density may be achieved. The heat dissipation elements may be formed on the basis of standard manufacturing techniques and may be positioned in close proximity to individual transistor elements and/or may be used for shielding particular circuit portions.

20 Claims, 6 Drawing Sheets

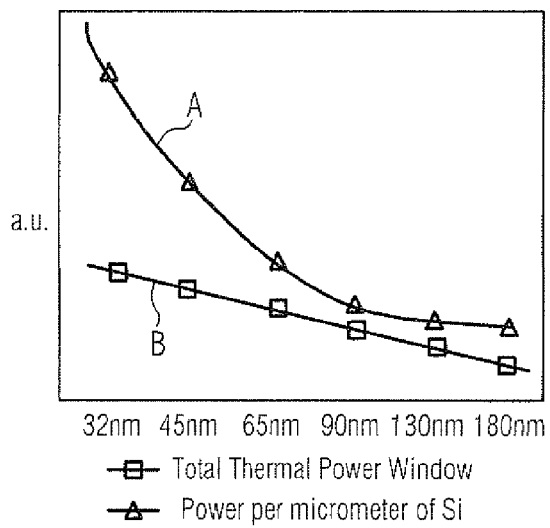
FIG. 1a
(prior art)
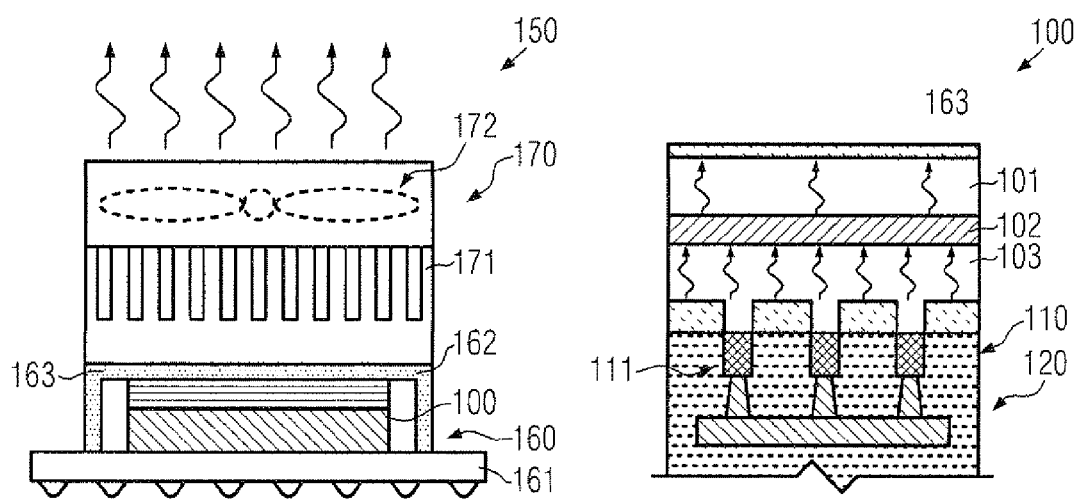
FIG. 1b
(prior art)
FIG. 1c
(prior art)

HEAT DISSIPATION IN TEMPERATURE CRITICAL DEVICE AREAS OF SEMICONDUCTOR DEVICES BY HEAT PIPES CONNECTING TO THE SUBSTRATE BACKSIDE

BACKGROUND OF THE INVENTION

1. Field of the Invention

The present disclosure generally relates to the field of integrated circuits, and, more particularly, to heat dissipation and thermal management of semiconductor devices.

2. Description of the Related Art

In modern integrated circuits, a very high number of individual circuit elements, such as field effect transistors in the form of CMOS, NMOS, PMOS elements, resistors, capacitors and the like, are formed on a single chip area. Typically, feature sizes of these circuit elements are continuously decreased with the introduction of every new circuit generation to provide currently available integrated circuits formed by volume production techniques with critical dimensions of 50 nm or less and having an improved degree of performance in terms of speed and/or power consumption. A reduction in size of transistors is an important aspect in steadily improving device performance of complex integrated circuits, such as CPUs. The reduction in size is commonly associated with an increased switching speed, thereby enhancing signal processing performance at transistor level.

In addition to the large number of transistor elements, a plurality of passive circuit elements, such as capacitors, resistors, interconnect structures and the like, are typically formed in integrated circuits as required by the basic circuit layout. Due to the decreased dimensions of the active circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analog circuits, digital circuits and the like, thereby providing entire systems on a single chip (SoC).

The increased packing density of integrated circuits resulting from the reduced device dimensions may also be accompanied by reduced switching speeds of the individual transistors in complex logic circuitry, thereby contributing to increased power consumption in MOS circuits, since the reduced switching speeds allow the operation of the transistors at higher switching frequencies, which in turn increases the power consumption of the entire device. Therefore, in sophisticated applications using densely packed integrated circuits, the heat generation may reach extremely high values due to the dynamic losses caused by the high operating frequency in combination with a significant static power consumption of highly scaled transistor devices owing to increased leakage currents that may stem from extremely thin gate dielectrics, short channel effects and the like. Therefore, great efforts are being made in order to reduce overall power consumption by restricting the usage of high performance transistors, which usually cause higher heat generation, to performance critical signal paths in the circuit design, while using less critical devices in other circuit areas. Moreover, appropriate mechanisms may be implemented to operate certain circuit portions "on demand" and control local or global operating conditions depending on the thermal situation in the semiconductor die.

The heat generated during the operation of the internal circuit elements is typically dissipated via the substrate material or the complex metallization system including highly conductive metals and sophisticated dielectric materials, depending on the overall configuration of the semiconductor device, the package accommodating the semiconductor device and the contact regime for connecting the metallization system to the wiring system of the package. Finally, the internally generated heat has to be transferred to the package and to an external cooling system connected to the package. Thus, a wide variety of cooling systems are typically used, with complex passive architectures, such as specifically designed heat sinks and heat pipes, and also expensive active cooling devices, for instance in the form of fans, water cooling systems, Peltier elements and the like. With the quest for high performance of complex semiconductor devices, the corresponding power consumption of semiconductor devices, such as microprocessors, have reached the 100 Watt range, while the shrinking technology ground rules have resulted in increased thermal density of these semiconductor devices, as more transistors are packed into a smaller die region. External heat management systems, e.g., systems which may be operated on the basis of the internal thermal state of the semiconductor device, may not permit a reliable estimation of the die internal temperature distribution due to the delayed thermal response of the package of the semiconductor device and the possibly insufficient spatial temperature resolution of device internal temperature monitoring systems. Accordingly, external cooling systems may have to be designed to take into consideration these restrictions and to provide sufficient operational margins with respect to heat control unless a certain risk of overheating, and thus possibly damaging specific critical circuit portions, may be caused.

FIG. 1a schematically illustrates a representation of the power density of advanced integrated devices for various technology standards, while a corresponding total thermal power window, that is, reliable margins for operating the device, is also depicted. For example, curve A in FIG. 1a illustrates an over-proportional increase of the power density, that is, the heat created per unit area of a semiconductor die, wherein the slope of the increase may become significantly steeper for a technology standard of 65 nm. On the other hand, curve B represents the corresponding progression of the allowable total thermal power, which may have to be respected in operating corresponding devices, which may substantially be determined by the overall heat dissipation capabilities of the semiconductor devices under consideration. Consequently, since a substantially linear increase of the total thermal power margins may be observed with the scaling of the device dimensions, while, on the other hand, the power density may over-proportionally increase, a corresponding adaptation of heat dissipation systems may be required, thereby resulting in extremely complex external cooling systems. That is, conventional available solutions rely on passive cooling devices, such as a metallic heat sink, to remove heat from the surface of the device, i.e., the package, and to transfer the heat to the ambient atmosphere by convection. Frequently, an active device, such as an exhaust fan, is added to the passive thermal cooling system to increase the rate of thermal energy removal in applications, where passive cooling is not sufficient to dissipate sufficient thermal energy so as to avoid physical damage to the system during full power operation.

FIG. 1b schematically illustrates a semiconductor device in combination with a conventional cooling system. As illustrated, an electronic system 150 comprises a semiconductor device 100, which may represent any complex integrated circuit, such as a microprocessor, a mixed signal system including power devices, small signal circuit portions, complex analog circuitry and the like, which may include transistor elements with extremely scaled critical dimensions, for instance in the range of 50 nm and less. The semiconductor device 100 is typically attached to a package 160, which may comprise a package lid 162 and a package substrate, which may comprise an appropriate wiring system so as to connect to the metallization system of the semiconductor device 100. For example, corresponding bond wires (not shown) may connect to complementary bond pads formed on a final metallization layer of the semiconductor device 100, while, in other cases, a direct contact of the package and the semiconductor device 100 may be established on the basis of an appropriate bump structure, as will be described later on in more detail. Moreover, in sophisticated applications, an appropriate material 163, also referred to as thermal interface material, is frequently provided to enhance the thermal conductivity for transferring heat from the semiconductor device 100 to the package lid 162 via the highly conductive material 163. Furthermore, the package lid 162 is in turn in contact with a cooling system 170, which comprises a passive component 171, for instance in the form of a metal cover having a high thermal conductivity and an increased surface area for enhancing heat transfer to the ambient. Furthermore, in more sophisticated applications, one or more active cooling devices 172, such as a fan and the like, may be provided to further enhance the heat dissipation from the passive component 171 to the ambient atmosphere. It should be appreciated that other exotic and expensive solutions for the cooling system 170 may frequently be used, in which, additionally or alternatively, liquid cooling designs and refrigeration may be implemented to increase the rate of thermal energy removal, thereby allowing semiconductor devices of ever-increased power consumption to function without sustaining thermally-induced damage. However, as the complexity of the cooling system 170 may increase, the corresponding costs increase and a higher rate of failure may be observed. Furthermore, increasing the thermal capacity of the external cooling system 170 in view of enabling even further increased power densities in the semiconductor device 100 may typically require an increase in size, for instance for the passive component 171, and/or capability of the active components, for instance of the component 172, may have to be increased, for instance by increasing fan speed for increasing the air volume and the like. For large scale systems, such as server farms, these active/passive cooling systems increase cost and complexity due to the dense installations required. Typically, the ability for decreasing system space requirements is reduced, as this could compromise the ability to implement larger cooling solutions necessary for safe operation. Furthermore, using sophisticated active devices in the cooling system may significantly increase the probability of creating damage in the equipment due to a failure of these complex active components, thereby contributing to increased system down time, while also increasing power consumption and thus overall cost of ownership compared to an all passive system.

FIG. 1c schematically illustrates the semiconductor device 100 in a cross-sectional view, wherein the overall heat dissipation capability may even further be restricted due to the internal configuration of the device 100. As illustrated, the semiconductor device 100 may be configured so as to be connected to a package by directly attaching a metallization system 120, which may comprise an appropriately configured bump structure, to a corresponding wiring system of the package. Thus, the heat may be dissipated via a substrate 101, which may finally be connected to an external interface, such as the thermal interface material 163. Consequently, in conventional strategies for increasing the dissipation capability of an electronic system, such as the system 150 as shown in FIG. 1b, the thermal interface material 163 may be modified to improve the overall thermal efficiency of the cooling system 170 (FIG. 1b). As discussed above, in other cases, the passive and active components of the corresponding cooling system may be increased or improved with respect to the heat dissipation capability. In the device 100 as shown in FIG. 1c, a significant improvement of the heat dissipation capability of the metal 163 in contact with the substrate 101 may result in a very limited overall improvement of the thermal condition in the device 100, since, in sophisticated device architectures, frequently, a buried insulating layer 102 may be provided, at least in performance driven device areas, in order to electrically insulate the substrate 101 from an active silicon layer 103. The silicon layer 103 may represent a part of a device level 110, in which circuit elements 111, such as transistors, resistors and the like, are formed. Furthermore, these circuit elements 111 are connected to a metallization system 120 which may have a highly complex configuration, as previously explained. Thus, upon operating the semiconductor device 100, heat generated by the circuit elements 111, for instance by fast switching transistor elements in complex logic circuit portions, is transferred to the substrate 101 and is finally dissipated via the interface 163. Due to the direct contact of the metallization system 120 with a corresponding wiring system of the package, a certain amount of heat may also be dissipated via the metallization system 120, depending on the heat dissipation capability of the corresponding package material in combination with the package internal wiring system. However, typically, the provision of sophisticated heat dissipation components may not be possible, since, typically, the package may connect to a printed wiring board and the like, thereby significantly reducing the possibility of providing additional heat dissipation areas, unless a significant increase of the overall length of the corresponding conductors is used, which may be disadvantageous with respect to the overall electrical performance. On the other hand, the heat transfer to the interface 163 via the substrate 101 may be significantly reduced due to the presence of the buried insulating layer 102, which may have an inferior thermal conductivity compared to the substrate 101 and the semiconductor layer 103. Consequently, the heat dissipation capabilities for highly sophisticated semiconductor devices, which may frequently comprise a silicon-on-insulator (SOI) architecture, may significantly restrict the packing density in the device level due to the restrictions with respect to overall power density, while, in other cases, sophisticated re-designs may have to be used in order to maintain the total thermal die power within the specifications for full power operation.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques and semiconductor devices in which the device internal thermal conductivity may be increased to allow an increase of the flow of heat to a corresponding thermal interface, thereby reducing, for a given heat dissipation capability, the requirements imposed on the external cooling system, which may directly translate into reduced costs and/or increased reliability. On the other hand, for given heat dissipation capabilities of an external cooling system, the increased device internal thermal conductivity may allow an increased power rating compared to an electrical equivalent semiconductor device, thereby enabling operation at increased clock frequencies and the like. Furthermore, due to the enhanced device internal thermal conductivity, an even further enhanced packing density may be obtained on the basis of a given technology standard, since the design of speed critical or generally power critical circuit portions may be based on an increased power density due to the superior heat dissipation capabilities.

To this end, heat dissipation elements or "heat pipes" may be formed in the semiconductor device so as to extend from the device layer to a relevant interface connected to an external cooling system, wherein, in some illustrative embodiments, the heat dissipation elements may be provided on transistor level. That is, one or more heat dissipation elements may be provided in close proximity to each critical transistor element, thereby providing a very efficient transfer of heat from the immediate neighborhood of the transistor active area to the thermally active interface. In other illustrative aspects disclosed herein, the heat dissipation elements may be provided in a more global manner, i.e., critical circuit portions, that is, a plurality of temperature critical circuit elements may be thermally connected to the external cooling system more efficiently, while also providing a certain degree of thermal isolation to neighboring, less temperature-critical circuit portions, so that, in total, an even further increased packing density may be achieved compared to conventional semiconductor devices.

One illustrative semiconductor device disclosed herein comprises a substrate comprising a front side and a back side. Furthermore, one or more transistor elements are formed in and above a semiconductor layer that is formed above a front side. Additionally, a metallization system is formed above the semiconductor layer. Finally, the semiconductor device comprises a heat dissipation element formed adjacent to the one or more transistor elements and extending into the substrate, wherein the heat dissipation element is electrically isolated from the one or more transistor elements and the metallization system and comprises a fill material having a thermal conductivity that is higher than a thermal conductivity of the semiconductor layer.

According to further aspects disclosed herein, a substrate is provided that may be used for forming semiconductor devices. The substrate comprises a semiconductor layer formed above a substrate material. Furthermore, a heat spreading layer is provided so as to be in contact with the substrate material, wherein the heat spreading layer has a thermal conductivity that is greater than a thermal conductivity of the substrate material and the semiconductor material.

One illustrative method disclosed herein comprises forming an opening adjacent to an active semiconductor region of a semiconductor device, wherein the opening extends at least into a substrate material of the semiconductor device. The method further comprises filling the opening with a fill material to form a heat dissipation element, wherein the fill material has a thermal conductivity that is higher than a thermal conductivity of the substrate material. Additionally, the method comprises connecting the heat dissipation element with a heat spreading layer formed on a back side of the substrate material.

BRIEF DESCRIPTION OF THE DRAWINGS

The disclosure may be understood by reference to the following description taken in conjunction with the accompanying drawings, in which like reference numerals identify like elements, and in which:

FIG. 1a schematically illustrates a graph representing the allowable total thermal die power and the power density of sophisticated semiconductor devices in relation to the corresponding technology standard;

FIG. 1b schematically illustrates a cross-sectional view of a conventional semiconductor device with an external cooling system;

FIG. 1c schematically illustrates a cross-sectional view of a semiconductor device having an SOI configuration and a corresponding heat dissipation therein in accordance with conventional device architectures;

FIG. 2l schematically illustrates a cross-sectional view of the semiconductor device that is to be attached to a package substrate on the basis of a flip-chip technology, wherein the thermal heat dissipation elements may provide superior transfer through the buried insulating layer, according to still further illustrative embodiments;

Figure 2A:
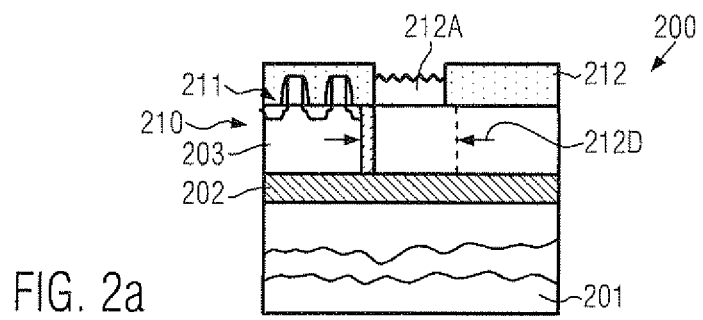
FIG. 2a schematically illustrates a cross-sectional view of a semiconductor device during an early manufacturing stage in forming a heat dissipation element in the vicinity of one or more transistor elements, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure provides semiconductor devices, substrates and manufacturing techniques in which efficiency of conventional external cooling systems may be significantly enhanced by increasing the device internal heat transfer capability on the basis of dedicated heat dissipation elements. Thus, by locally providing a material having a significantly higher thermal conductivity compared to standard semiconductor material, such as silicon, and of typically used dielectric materials, such as silicon dioxide, low-k dielectric materials and the like, the heat transfer capability may be locally increased, thereby also enhancing the overall energy transfer to an external cooling system, the efficiency of which may thus increase without additional effort. The heat dissipation elements, which may also be referred to as heat pipes hereinafter, may be positioned in close proximity to temperature critical device areas, such as the active region of temperature critical transistor elements, thereby generally allowing an increased packing density of temperature critical circuit elements. In other cases, the heat dissipation elements may be efficiently positioned to provide a certain degree of thermal isolation of temperature critical circuit portions with respect to less critical circuit portions, such as sophisticated logic circuit portions and cache memory portions, in which a high packing density of less critical transistors may typically be used, however, without generating pronounced waste heat. Consequently, a steeper temperature gradient may be established between these circuit portions, thereby enabling a reduced offset, which may, in total, contribute to enhanced packing density, even though a certain degree of floor space may have to be provided for the heat dissipation elements. For example, temperature critical circuit portions, such as power transistors, fast switching transistor elements and the like, may be laterally enclosed by heat dissipation elements, thereby providing a "ring" of thermally isolating elements, which may thus significantly reduce a range of thermal influence on other circuit areas.

As a consequence, the present disclosure provides sufficient thermally highly conductive parts that connect temperature critical circuit elements in a highly local manner with an external heat dissipation system in any appropriate configuration, thereby significantly enhancing the overall heat dissipation capabilities of the semiconductor device. Also, a dedicated enhanced heat dissipation may be established on a more global scale by distributing or clustering a corresponding number of heat dissipation elements and/or adapting the size thereof to the global thermal conditions within a specific circuit area. In some illustrative embodiments disclosed herein, the heat dissipation elements may be positioned so as to not unduly consume semiconductor area so that, in total, the packing density may be increased due to a higher design flexibility with respect to the device internal heat distribution, that is, a distance between temperature critical devices and temperature sensitive devices, may be reduced and also the power density may be increased. In other cases, for a given packing density in temperature critical circuit portions, relaxed conditions with respect to operating frequency and/or supply voltage may be provided, thereby enabling establishing an efficient mechanism for enhancing reliability and performance over the lifetime of the semiconductor devices. For example, by enhancing heat dissipation capabilities of critical circuit elements, the thermal stress and thus aging of these circuit elements may be reduced, while at the same time a wider window for operating the semiconductor devices may be applied, which may thus also enhance the efficiency of compensation mechanisms for reducing performance loss over the operational lifetime, which may frequently be based on an increase of supply voltage and/or operating frequency.

With reference to FIGS. 2a-2l, 3a-3b and 4, further illustrative embodiments will now be described in more detail, wherein reference may also be made to FIGS. 1a-1c if required.

FIG. 2a schematically illustrates a cross-sectional view of a semiconductor device 200 comprising a substrate 201, above which may be formed a semiconductor layer 203, which may represent any appropriate semiconductor material for forming therein and thereabove circuit elements 211, such as transistors, capacitors, resistors and the like, as required. Similarly, the substrate 201 may represent any appropriate material for forming thereabove the semiconductor layer 203. For instance, the substrate material 201 may be provided in the form of a silicon material, an insulating carrier material and the like. As previously explained, presently and in the foreseeable future, sophisticated semiconductor devices will be formed on the basis of silicon, due to the well-established materials and process techniques that may be used in volume production facilities. Furthermore, the semiconductor layer 203 and the substrate material 201 may represent a bulk configuration, at least in some areas of the semiconductor device 200, in which the substrate material 201 may comprise a substantially crystalline semiconductor material that may be in direct contact with the semiconductor layer 203. In other illustrative embodiments, as shown in FIG. 2a, a buried insulating layer 202 may be provided between the substrate material 201 and the active semiconductive layer 203. As previously discussed, the buried insulating layer 202 may significantly reduce the overall "vertical" heat dissipation capabilities of the device 200. It should further be appreciated that the dimensions illustrated in FIG. 2a are not to scale, for instance, the substrate material 201 may have a significantly greater thickness compared to the active semiconductor layer 203, depending on the type of semiconductor device to be formed. For example, in sophisticated logic circuitry with fast switching transistor elements 211, a thickness of the layer 203 may be approximately 100 nm and less, while, in other applications, for instance including power transistors and the like, the semiconductor layer 203 may have a thickness of several 100 nm or even several micrometers and more, in order to provide the required dielectric strength that may typically be required for power circuitry portion. Furthermore, the in embodiment shown, the circuit elements may be provided in an advanced manufacturing stage, i.e., high temperature process may have already been performed, for instance for activating dopant species and re-crystallizing implantation-induced damage, and, if required, at least a portion of a dielectric material may be formed above the circuit element 211. In this case, respective metal silicide regions (not shown) may have been formed in the circuit elements 211, while, in other cases, a corresponding silicide process may be formed in a later manufacturing stage. It should be appreciated that heat dissipation elements may be formed at any other appropriate manufacturing stage, for instance, prior to actually forming the transistor elements 211, if corresponding materials used may be compatible with the high temperature processing that may typically be applied during the fabrication of the transistor elements 211. In this case, appropriate materials, such as carbon and the like, may provide moderately high thermal and electric conductivity, since carbon material may provide enhanced temperature stability even at high temperature processes. Furthermore, in the manufacturing stage shown, an etch mask 212 may be provided, which may comprise a photoresist material in combination with any appropriate dielectric material that may be used as a hard mask material during the further processing. For example, the etch mask 212 may be comprised of resist material in combination with an interlayer dielectric material or at least a portion thereof, which may be patterned on the basis of the resist material. Thus, the mask layer 212 may comprise a corresponding opening 212A, which defines the lateral position of a heat dissipation element to be formed, wherein a lateral size of the corresponding heat dissipation element may be defined on the basis of the opening 212A and corresponding etch process parameters to be used during the subsequent etch process.

The semiconductor device 200 as shown in FIG. 2a may be formed on the basis of the following processes. After providing the substrate 201 in combination with the semiconductor layer 203, appropriate active regions may be defined in the layer 203, for instance by forming appropriate isolation structures (not shown), which may be accomplished on the basis of well-established process techniques. It should be appreciated that the basic design of the semiconductor device 200 may be appropriately adapted so as to enable an efficient positioning of the opening 212A in a later manufacturing stage to provide a desired spatial relationship of a heat dissipation element still to be formed and temperature critical circuit elements. That is, in some illustrative embodiments, the opening 212A may be positioned adjacent to circuit elements and thus active regions within isolation structures, which may thus be appropriately dimensioned in order to accommodate the opening 212A. In other illustrative embodiments, corresponding heat dissipation elements may be positioned "within" an active region in order to provide enhanced thermal coupling to the circuit element(s) under consideration, wherein a corresponding electrical insulation may be accomplished by providing moderately thin dielectric material or by providing the material of increased thermal conductivity that is to be filled in a later manufacturing stage may provide a dielectric behavior. After forming respective isolation structures, the circuit elements 211 may be formed on the basis of a corresponding technology standard and according to the corresponding design rules so as to obtain the desired overall circuit layout. For instance, the transistors 211, when provided in the form of field effect transistors, may include sophisticated transistor types having critical dimensions of 50 nm and less, wherein, typically, the power consumption per area may be moderately high, as is, for instance, previously discussed with reference to FIG. 1a. Furthermore, less critical transistor elements may be provided, for instance in device areas corresponding to cache areas of microprocessors and the like, wherein, however, corresponding design requirements with respect to thermal management in the device 200 may be significantly relaxed due to the provision of the heat dissipation elements that have to be formed on the basis of the opening 212A. It should be appreciated that temperature critical individual transistor elements may be identified during the design phase of the device 200 and a corresponding spatial arrangement of the opening 212A with respect to the one or more temperature critical transistors may be accomplished to provide superior heat dissipation capabilities directly at the source of creating the waste heat. Consequently, in this case, the corresponding heat dissipation elements may be positioned in a very local manner, i.e., on transistor level, while, in other cases, in addition to or alternatively, a plurality of heat dissipation elements may be provided to enhance the heat dissipation capabilities of extended circuit areas, as will be described later on in more detail. After completing the basic transistor configurations in and above the semiconductor layer 203, thereby forming a device level 210, an interlayer dielectric material, such as silicon nitride, silicon dioxide, nitrogen-containing silicon carbide and the like, may be provided, for instance, in any appropriate form, for instance as a highly stressed dielectric material, in accordance with the overall requirements of the transistors 211 in the device level 210. Next, the etch mask 212 may be formed, which may represent a portion of the interlayer dielectric material and the like, as previously discussed. For this purpose, well-established lithography techniques may be used for forming a resist mask, which may then be used for defining the etch mask 212 having the opening 212A at a desired position and with a corresponding lateral size. It should be appreciated that an appropriate distance 212D may be defined during the lithography process so as to stay within any process-related margins with respect to process variations of the lithography process and of the subsequent etch process. That is, the distance 212D may be selected on the basis of the overlay performance of the corresponding lithography process and the characteristics of the subsequent etch process.

Figure 2B:
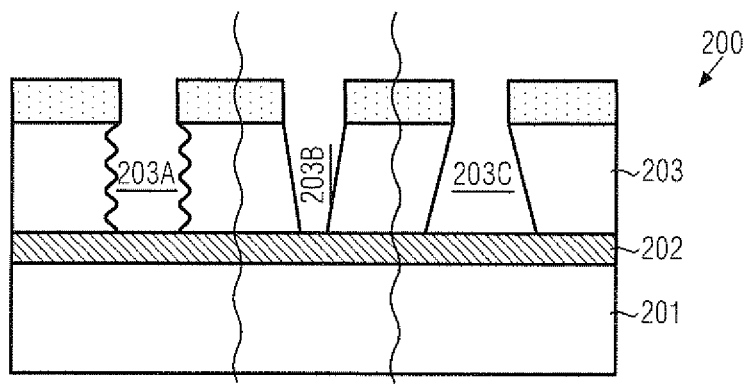
FIGS. 2b-2d schematically illustrate cross-sectional views of the semiconductor device during various manufacturing stages in forming an opening for a heat dissipation element according to different variants for etching through the active semiconductor layer and into and through the substrate material, according to illustrative embodiments.

FIG. 2b schematically illustrates the semiconductor device 200 in a further advanced manufacturing stage, in which an opening may be formed in the semiconductor layer 203 or within a corresponding isolation structure formed in the semiconductor layer 203. As illustrated in FIG. 2b, for convenience, three typical general shapes of respective openings 203A, 203B and 203C are illustrated, which may be obtained on the basis of the same lateral size of the opening 212A (FIG. 2a), however, with different etch strategies. It should further be appreciated that the corresponding shapes of the openings 203A, 203B, 203C are exaggerated in order to more clearly demonstrate the characteristic behavior of specific etch recipes. For instance, the opening 203A may be obtained on the basis of a plasma-assisted anisotropic etch recipe, wherein, in general, substantially "vertical" sidewall angles may be obtained with corresponding etch irregularities. For example, a plurality of selective plasma-assisted anisotropic etch recipes are available for a plurality of semiconductor materials, such as silicon, silicon/germanium and the like, and may be efficiently used for forming the opening 212A (FIG. 2a). On the other hand, anisotropic wet chemical etch chemistries may also be used which may have an anisotropic removal rate with respect to different crystallographic directions so that a corresponding crystallographic plane may act as an "etch stop plane," For example, potassium hydroxide, TMAH (tetramethylammonium hydroxide) and the like are well known as wet chemical agents for etching silicon material with a high degree of selectivity to other materials, such as silicon dioxide, silicon nitride and the like, thereby obtaining a shape as illustrated for opening 203B. Moreover, the opening 203C may be obtained by appropriately adjusting process parameters of an isotropic etch process, for instance, performed on the basis of a plasma-assisted etch ambient, in which the lateral removal rate may increase with increasing depth of the opening 203C. Also, in this case, a plurality of well-established etch recipes may be used. In the embodiment shown, the corresponding etch process may be stopped on or within the buried insulating layer 202, which may act as etch stop material. In other cases, when a bulk configuration is provided, the etch recipes may be appropriately adapted so as to etch through the layer 203 and the substrate material 201 to any appropriate depth.

Figure 2C:
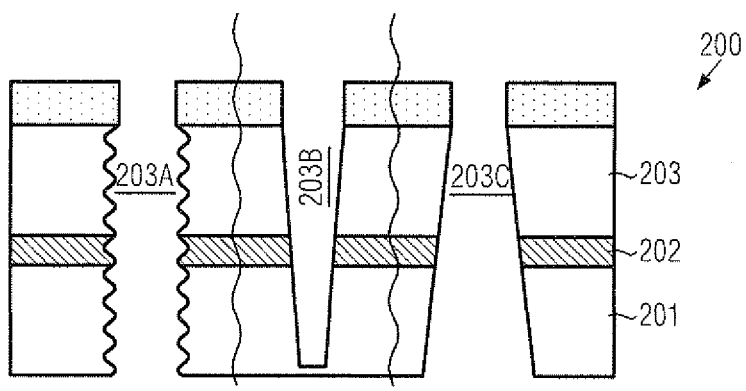

FIG. 2c schematically illustrates the semiconductor device 200 in a further advanced manufacturing stage. Again, a plurality of different possibilities for etching through substrate materials 201 are illustrated. As shown, the opening 203A may now extend through the buried insulating layer 202, if provided, and may also extend through the substrate material 201. Again, it should be appreciated that the dimensions are not shown to scale. For example, the substrate material is illustrated so as to have a comparable thickness in FIG. 2c, where, however, the material 201 may have a thickness of approximately 100 μm and significantly more, depending on the initial thickness of a corresponding base substrate. Furthermore, as shown in FIG. 2c, the openings 203A, 203B, 203C may extend through the entire substrate material 201 and terminate at a back side thereof, while, in other cases, a portion of the material 201 may be maintained at the back side, as is for instance illustrated for the opening 203B. It should be appreciated that, in some illustrative embodiments, more than one type of opening may be provided, which may be accomplished by forming one type of opening first and subsequently providing a further etch mask and forming another type of opening by performing an additional etch process. Furthermore, the different types of openings may be "mixed," for instance, by appropriately changing a corresponding etch recipe in order to obtain a desired final shape of a corresponding opening, such as openings 203A, 203B, 203C. For example, for forming the opening 203A, the etch chemistry may be appropriately adapted so as to etch through the buried insulating layer 202, if provided, and subsequently a similar process recipe may be used, as previously applied for etching through the active semiconductor layer 203. In other cases, after opening the buried insulating layer 202, a different etch recipe, such as a wet chemical etch recipe, a plasma-assisted isotropic etch behavior and the like, may be used so as to obtain a different type of shape within the substrate material 201. Consequently, a wide variety of types of openings may be provided, which may be advantageous with respect to the overall thermal conductivity and the fill behavior during the subsequent manufacturing steps.

Figure 2D:
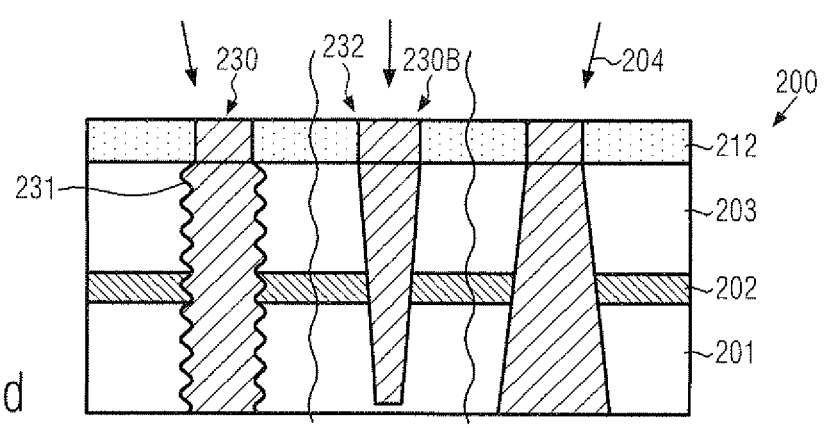

FIG. 2d schematically illustrates the semiconductor device 200 in a further advanced manufacturing stage in which material may be filled into the openings of the various types, such as openings 203A, 203B, 203C as illustrated in FIG. 2c. For this purpose, the device 200 may be exposed to a sequence of processes 204, in which at least a thermally conductive material 232 may be filled into the corresponding openings. In some illustrative embodiments, additionally, an insulating liner, such as a silicon dioxide material, a silicon nitride material or any other dielectric material may be provided, if the fill material 232 may represent an electrically conductive material and a direct contact of the fill material 232 with the surrounding active semiconductor layer 203 is considered inappropriate. In other cases, the corresponding openings may be formed in isolation structures, thereby providing a desired electrical insulation of the fill material 232 with respect to the active semiconductor material 203. The fill material 232, in combination with the optional liner material 231, may thus form a heat dissipation element 230, which may extend from the active semiconductor layer 203 into the substrate material 201 and may connect to the back side or terminate in the vicinity of the back side, for example, several hundred nm to several μm, as is, for instance, illustrated for the heat dissipation element 230B in FIG. 2d. The process sequence 204 may be formed on the basis of any well-established deposition technique, for instance using electrochemical deposition processes in order to fill in copper material, wherein, in addition to insulating liner material 231, if required, an appropriate barrier layer may be provided, such as tantalum, tantalum nitride and the like, so as to provide a desired degree of copper confinement. In other cases, aluminum may be deposited, for instance on the basis of sputter deposition and the like, using well-established process recipes. It should be appreciated, however, that a plurality of metal materials may typically be used during the fabrication of complex semiconductor devices, and any of these materials may be used for forming the heat dissipation elements 230. For instance, tungsten, cobalt, titanium and the like may also represent materials that provide superior heat conductivity compared to silicon and silicon dioxide. In other cases, other materials, such as specifically designed semiconductor materials having an enhanced thermal conductivity compared to the substrate material 201, the buried insulating material 202 and the active layer 203 may be used, which may be deposited on the basis of epitaxial growth techniques and the like. For example, as previously discussed, carbon material may be deposited which may provide increased thermal conductivity, while also providing a high degree of stability during high temperature process techniques. In this case, the heat dissipation element 230 may also be formed prior to performing a high temperature process as may typically be used for forming the circuit elements 211 (FIG. 2a). Consequently, in this case, the sequence for forming the openings 203A, 203B, 203C (FIG. 2c) and finally filling the same to obtain the heat dissipation elements 230 may be implemented at any appropriate manufacturing stage, depending on the overall process requirements.

In still other illustrative embodiments, other materials, for instance in the form of a working fluid in the manner of heat pipes of macro systems, may be filled in, such as methylane glycol and the like, which may be accomplished on the basis of wet chemical treatments and the like during the sequence 204. In this case, an appropriate confinement of the working fluid in the heat dissipation element 230 may be accomplished by specifically designing the deposition process for a further material and/or by forming a material plug, for instance a metal plug, at the back side prior to the filling in of the working fluid and forming another plug for closing a corresponding dissipation element 230, and any other appropriate material, for instance by depositing a further material, as will be described with reference to FIG. 2e in more detail.

Thus, a plurality of well-established deposition techniques may be available, which may also include deposition/etch cycles for enhancing the fill capability of the corresponding sequence, depending on the configuration of the corresponding openings. Furthermore, back side deposition techniques may also be used to enhance the fill behavior, if required. After filling in the fill material 232, possibly in combination with the liner material 231, further processing may be continued, for instance, by removing any excess material, for instance by using chemical mechanical polishing (CMP) techniques and the like. Thereafter, the metallization system of the semiconductor device 200 may be formed in accordance with well-established process strategies, which may also include the fabrication of an appropriate back side metallization, which may, depending on the overall configuration of the heat dissipation element 230, be in direct contact or may at least be thermally coupled to the element 230 so as to allow an efficient thermal coupling to a package and finally to an external cooling system, as also previously described with reference to FIGS. 1b-1c. In some illustrative embodiments, the etch mask 212 may be removed, and the further processing may be continued by forming an appropriating contact structure, for instance by forming a metal silicide in exposed semiconductor regions on the basis of well-established manufacturing techniques, and thereafter an appropriate interlayer dielectric material, for instance partially in the form of a highly stressed material, may be deposited according to well-established techniques, thereby also providing a platform for forming further metallization levels in accordance with process and device requirements. Consequently, also in this case, an efficient decoupling of the heat dissipation element 230 from the metallization system of the device 200 may be accomplished, while also providing a high degree of compatibility with conventional process strategies.

Figures 2E, 2F:
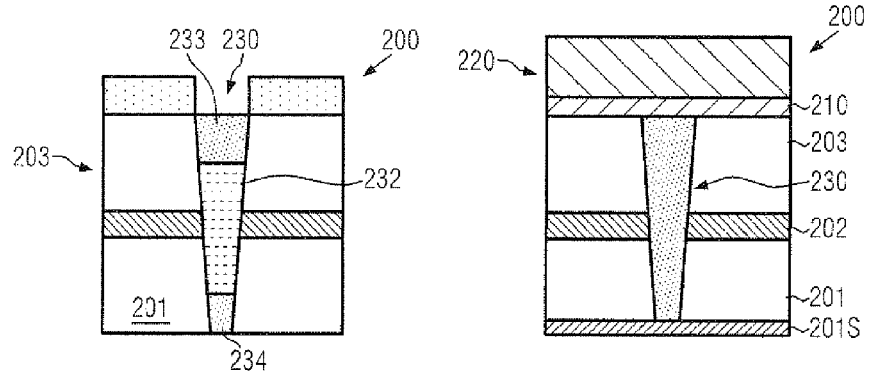
FIG. 2e schematically illustrates a cross-sectional view of a semiconductor device including a heat dissipation element comprising a working fluid as a heat transfer medium, according to illustrative embodiments.
FIG. 2f schematically illustrates the semiconductor device in which the heat dissipation element may be in contact with a heat spreading material formed on the back side of the substrate, according to illustrative embodiments.

FIG. 2e schematically illustrates a cross-sectional view of the semiconductor device 200 in which the heat dissipation element 230 comprises a working fluid as the fill material 232 in combination with appropriate material plugs 233 and 234 for confining the working fluid 232. In this case, the plug 233 may be formed in accordance with well-established techniques, for instance, recipes for forming tungsten plugs are well established in order to provide corresponding plugs connecting to contact areas of circuit elements and the like. In this case, the plug 234 may be formed on the basis of appropriate manufacturing techniques from the back side and thereafter the material 232 may be filled in and may be confined by forming the plug 233. In other cases, the plug 233 may be formed and thereafter a working fluid 232 may be filled in from the back side and a subsequent back side deposition process may ensure a reliable confinement of the working fluid 232. It should be appreciated that the plugs 233, 234 may also be formed on the basis of appropriately selecting process parameters of a deposition process such that a "closure" of the corresponding opening may be accomplished without depositing significant amounts of materials in deeper areas of the corresponding opening. In this manner, one of the plugs 233, 234 may be provided and subsequently the working fluid 232 may be filled in, followed by a subsequent deposition step for confining the working fluid 232.

FIG. 2f schematically illustrates the semiconductor device 200 in a further advanced manufacturing stage. As illustrated, the device 200 may comprise the device level 210, which is thermally coupled to the heat dissipation element 230, as previously explained, and a metallization system 220 may be formed above the device level 210, which may electrically be decoupled from the heat dissipation element 230. In the embodiment shown, the metallization system 220 may be configured so as enable direct contact with a wiring system of a package substrate, as previously explained with reference to the device 100 of FIG. 1c. Hence, in this case, superior heat dissipation capabilities may be provided on the basis of the element 230 by coupling the device level 210 to the back side of the substrate 201, which may act as a heat dissipation interface. Furthermore, in some illustrative embodiments, a heat spreading layer 201S may be formed on the back side of the substrate material 201, thereby providing enhanced heat transfer from the dissipation element 230 to the entire back side of the substrate material 201, which may represent an interface for heat transfer with a substrate package, as previously explained. In some illustrative embodiments, the heat spreading layer 201S may be provided in the form of a metal layer, wherein a corresponding electrical insulation from sensitive device areas in the device level 210 may be accomplished on the basis of an internal insulating layer of the element 230, as previously explained, while, in other cases, the element 230 may be formed within an isolation area, thereby also providing a corresponding insulation, even if the heat spreading material 201S may be provided in the form of an electrically conductive material. In other cases, the heat spreading layer 201S may be provided in the form of any thermally conductive material that may provide enhanced interface characteristics, such as indium, which has frequently been used as a thermal interface material in many cases. Consequently, the heat dissipation element 230 may be provided such that interference with any desired type of interface at the back side of the substrate material 201 may be substantially avoided. Consequently, after connecting the semiconductor device 200 with an appropriate package substrate and attaching the cooling system, as is, for instance, previously described with reference to the semiconductor device 100, a thermally conductive path with significantly enhanced heat transfer capabilities between the external cooling system and the device level 210 may be established via the element 230.

Figure 2G:
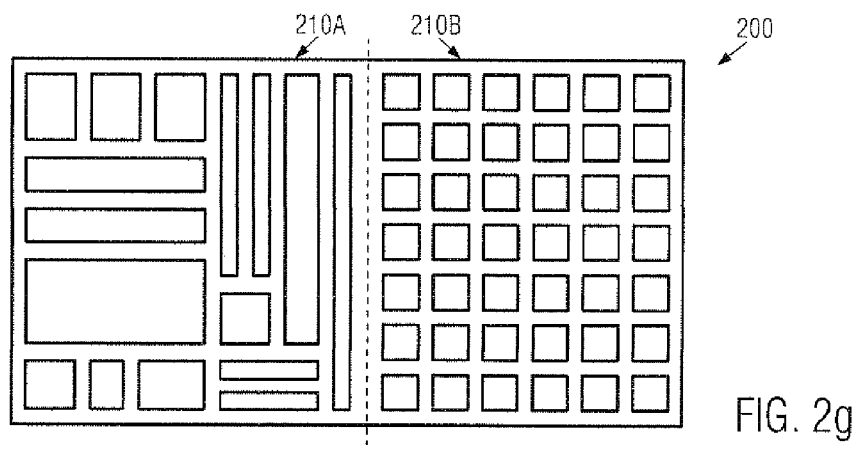
FIG. 2g schematically illustrates a top view of a complex semiconductor device in which temperature critical device areas and less critical areas are illustrated.

FIG. 2g schematically illustrates a top view of the semiconductor device 200, i.e., of the device level thereof or a layout of the device level, when representing a sophisticated logic circuit portion, such as a CPU, or any other logic circuitry requiring speed critical transistor elements, in combination with a densely packed device area, however, including transistor elements of less speed critical behavior, for instance as may be required in a memory area and the like. Thus, as illustrated, a first device region 210A may correspond to a device region of high power density, since a plurality of speed critical transistor elements operated with high clock frequencies and having a high drive current capability are provided in region 210A. On the other hand, a device region 210B may represent an area of reduced power density, wherein, however, the actual packing density, that is, the number of transistor elements per unit area, may be moderately high. Thus, in conventional designs and strategies, the packing density in the temperature critical device region 210A may have to be adapted to a desired performance, for instance by appropriately adapting the clock frequency, and/or maintaining a certain minimum packing density and also providing a corresponding distance between the regions 210A, 210B so as to stay within specified temperature conditions even under "full" cooperation. Due to the appropriate positioning of heat dissipation elements, as previously described, performance of the device 200 may be extended for a given general circuit layout, for instance with respect to a high packing density in the device region 210B, or, for a given performance grade, the overall packing density may even be increased, for instance by more closely packing critical transistors in the area 210A and also by reducing a certain distance between the device regions 210A, 210B. For this purpose, the lateral position of the corresponding heat dissipation element may be appropriately selected to achieve enhanced performance and/or superior packing density.

Figure 2H:
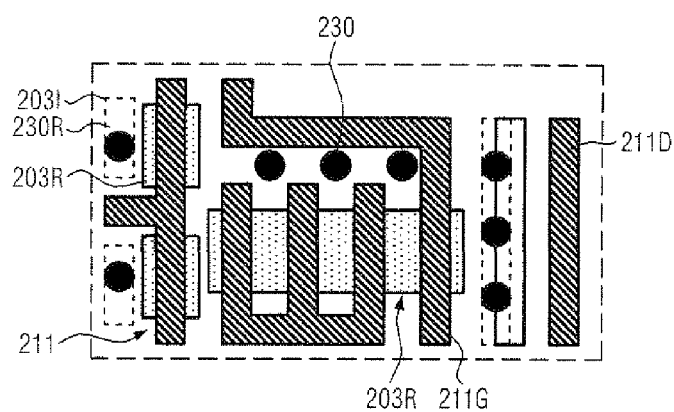
FIG. 2h schematically illustrates a top view of a layout of a semiconductor device including a plurality of heat dissipation elements positioned in close proximity to temperature critical circuit elements, according to further illustrative embodiments.

FIG. 2h schematically illustrates a top view of a portion of the semiconductor device 200 within the temperature critical device region 210A (FIG. 2g). As illustrated, a plurality of the transistors 211 are laterally embedded into an isolation structure 203I, which may be provided in the form of a shallow trench isolation. Thus, a plurality of active regions 203R, in which one or more transistor elements may be provided, are appropriately electrically isolated by the isolation structure 203I. The transistors 211 may comprise corresponding gate electrode structures 211G, for instance provided in the form of a polysilicon material, possibly in combination with other metal-containing materials, such as metal silicide and the like. Furthermore, typically, respective dummy structures 211D, for instance dummy gate electrode structures, may be provided to enhance the process conditions during critical process steps, such as lithography, CMP and the like. That is, by providing the dummy structures 211D, process uniformity may be enhanced by providing for a more uniform overall device topography and the like. In the embodiment shown, performance of the semiconductor device 200, i.e., of the illustrated temperature critical circuit portion, may be enhanced on the basis of a given layout of the transistor elements 211, by appropriately positioning one or more heat dissipation elements 230, without requiring additional chip area. As previously explained, for a given basic circuit layout, enhanced performance and reliability may be accomplished due to the superior heat dissipation capabilities provided by the elements 230. For example, a plurality of the elements 230 may be positioned within the isolation structure 203I, thereby providing a desired electrical insulation of the elements 230, even if formed on the basis of a metal material without an insulating liner material, as previously explained. Thus, although in this case the thermal coupling to the corresponding active regions 203R may be slightly reduced due to the lower thermal conductivity of the insulating material of the structure 203I, nevertheless a pronounced heat dissipation capability may be accomplished. In other cases, as previously explained, one or more of the active regions 203R may be appropriately increased, however, without increasing the overall floor space, for instance by "sacrificing" one or more of the dummy structures 211D, so as to provide one or more of the isolation structures 203I within a corresponding active region 203R, thereby providing a high thermal coupling, while electrical insulation may be accomplished by providing a non-conductive fill material or by providing a thin insulating liner material, as previously explained. Moreover, the enhanced thermal coupling to the active regions 203R may also be accomplished by appropriately adapting the lateral size and shape of the heat dissipation elements 230 to lateral dimensions of the corresponding transistor elements 211. For example, as indicated, some of the heat dissipation elements 230 may be provided in a substantially rectangular shape, as indicated by the dashed lines 230R, thereby increasing the thermal coupling to the complimentary active region 203R via material of the isolation structure 203I. Furthermore, the increased cross-sectional area may also provide a superior "vertical" heat transfer capacity. Thus, upon appropriately implementing heat dissipation elements 230, a significant increase of the heat dissipation capabilities may be accomplished in a local manner, that is for individual transistor elements, while substantially not requiring significant modifications of the basic circuit layout. On the other hand, the thermal influence of the temperature critical transistor on other device areas, such as the densely packed area 210B (FIG. 2g) may be reduced, thereby also contributing to increased performance and reliability of these circuit areas.

With respect to FIGS. 2i-2j, further illustrative embodiments will now be described in which appropriately positioned heat dissipation elements may enable enhanced heat management in a more global scale by reducing the influence of the temperature critical circuit portion on the basis of a certain degree of thermal isolation.

Figure 2I:
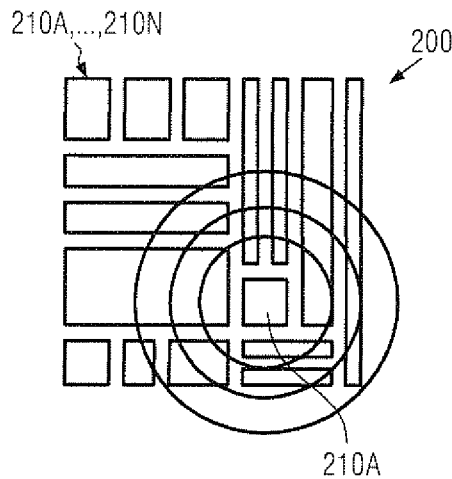
FIGS. 2i-2j schematically illustrate a layout for the implementation of a temperature critical circuit portion and the corresponding heat distribution without (FIG. 2I) and with (FIG. 2j) a plurality of heat dissipation elements laterally surrounding the temperature critical circuit portion for providing enhanced thermal isolation, according illustrative embodiments.

FIG. 2i schematically illustrates a plurality of circuit portions 210A . . . 210N according to a conventional device layout, wherein at least one of the device areas 210A . . . 210N may represent a "hot spot," i.e., a circuit portion, that may, at least during specific operational modes, create a significant amount of waste heat. For example, device region 210A may represent a circuit portion including the plurality of performance driven transistor elements which, when operated at full speed, may contribute to an increased power consumption and thus increased heat generation. Consequently, during a corresponding operating mode, the heat may be distributed across the remaining circuit portions, thereby also affecting the thermal status thereof in a more or less pronounced manner. For instance, as previously explained, temperature sensitive devices may have to be positioned with a certain distance with respect to the hot spot 210A. If respective dissipation elements in a desired high number may not be implemented in the overall circuit layout, for instance without requiring significant redesigns and the like. In still other illustrative embodiments, a corresponding hot spot region, such as the circuit portion 210A, may be identified during the design phase and may be appropriately thermally isolated from the neighborhood by providing a plurality of heat dissipation elements so as to laterally enclose the portion 210A.

Figure 2J:
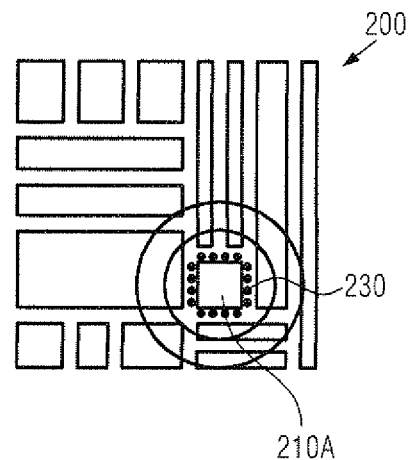

FIG. 2j schematically illustrates the semiconductor device 200 in which a plurality of heat dissipation elements 230 may be formed around the circuit portion 210A, thereby providing a "heat sink ring" around portion 210A. Thus, as illustrated, the thermal influence on the neighboring circuit portions may be significantly reduced, thereby providing enhanced design flexibility, since even temperature critical devices may be positioned more closely to the region 210A. It should be appreciated that the heat dissipation elements 230 may be arranged in any appropriate manner and may also have any appropriate lateral shape and size so as to obtain the desired shielding effect without significantly affecting the overall layout, for instance with respect to providing signal lines and the like. Since typically the circuit portion 210A may represent a functional block, the heat dissipation elements 230 may be implemented at a periphery thereof without requiring additional floor space, so that the general packing density may not be reduced, while, however, performance, reliability and design flexibility may be improved. In other illustrative embodiments, due to the space efficient manner with which the dissipation elements 230 may be provided in the vicinity of temperature critical devices or device portions, a further increase of packing density of circuit elements may be accomplished, thereby contributing to further scalability of the technology under consideration, while relaxing constraints with respect to the total thermal power windows, as previously explained with reference to FIG. 1a.

Figure 2K:
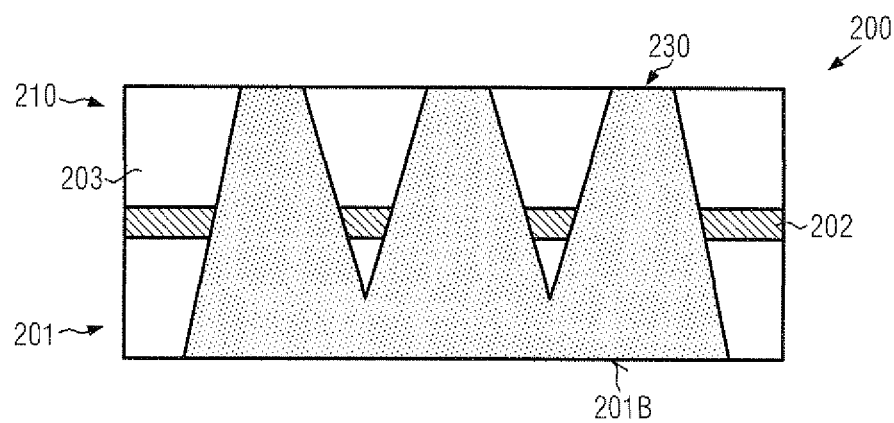
FIG. 2k schematically illustrates a plurality of heat dissipation elements which are in contact with the lower portion of the substrate material, in order to enhance the overall thermal conductivity, according to still further illustrative embodiments.
Figure 2I:
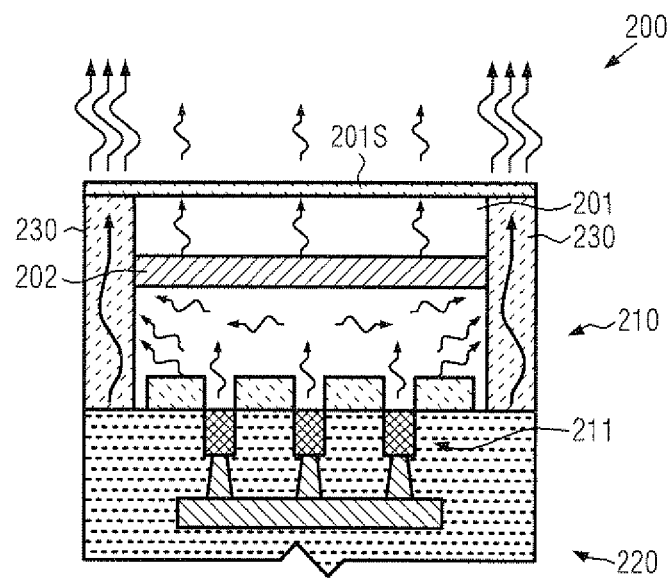

FIG. 2k schematically illustrates a cross-sectional view of the semiconductor device 200 according to illustrative embodiments in which the overall heat dissipation capabilities of a plurality of elements 230 may be increased without actually requiring a significant increase of the floor space within the device 200. As illustrated, the lateral dimension of the dissipation elements 230 may increase with increasing depth, wherein, in the embodiment shown, even a contact of the elements 230 may be accomplished within the substrate material 201. Consequently, in this case, a pronounced surface area at the back side 201B may be efficiently coupled to the device level 210, even if the available floor space therein may be restricted. For instance, for configurations as shown in FIG. 2a, a large back side contact area for the elements 230 may be provided, however, without consuming undue chip area in the device level 210. Similarly, in the embodiment shown in FIG. 2j, a very efficient thermal coupling to the back side may be accomplished for a plurality of elements 230, while not unduly consuming chip area in the device level.

FIG. 2l schematically illustrates the semiconductor device 200 during operation according to illustrative embodiments. As shown, the metallization system 220 may be connected to a corresponding wiring system of a package (not shown), for instance, via a corresponding bump structure or any other contact regime, such as wire bonding and the like. In other cases, the metallization system 220 may connect to a corresponding contact structure of a further semiconductor chip if a corresponding three-dimensional chip configuration is considered. Furthermore, one or more temperature critical transistors 211 are provided in the device level 210 and may be thermally coupled to the heat dissipation elements 230, which may, for instance, directly connect to the active region, possibly via a thin insulating material, as previously explained, or the elements 230 may be positioned in close proximity within an isolation structure, as also previously discussed. Thus, during operation of the transistors 211, waste heat is generated in device level 210 and is efficiently conducted to the heat spreading layer 201S via the dissipation elements 230, as is also previously explained. Again, it should be appreciated that a thickness of the substrate material 201 with respect to the device level 210 is not drawn to scale. The heat spreading layer 201S may be connected to a corresponding package or any other material, which may finally be in thermal contact to any appropriate cooling system which, compared to conventional strategies, may be provided in the form of only passive elements due to the enhanced thermal connection to the device level 210, thereby providing superior reliability and also reducing overall system costs. In other cases, any other appropriate cooling system may be used, wherein, however, reduced complexity for a given configuration and operating mode of the semiconductor device 200 may be sufficient.

Figure 3A:
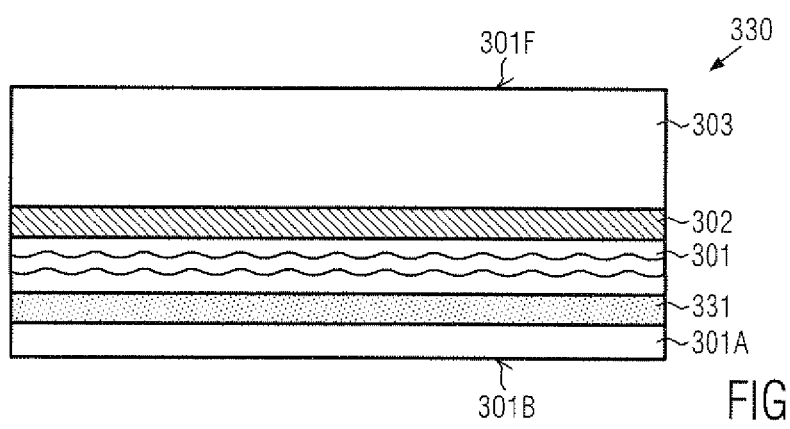
FIGS. 3a-3b schematically illustrate cross-sectional views of a substrate in a non-processed state (FIG. 3a) and in an advanced manufacturing stage (FIG. 3b), wherein a heat spreading layer may be incorporated in the substrate to enhance the fabrication of heat dissipation elements, according to illustrative embodiments.
Figure 3B:
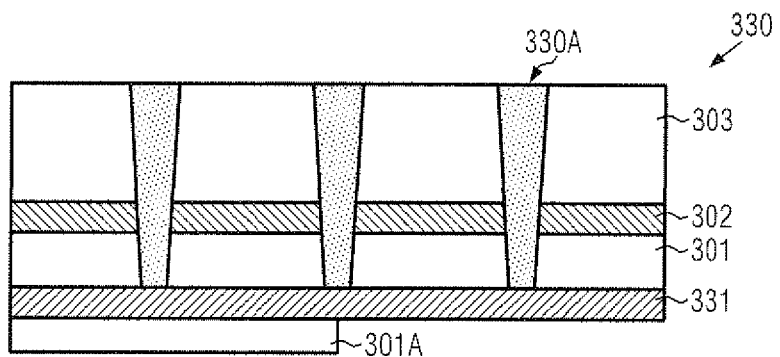

With reference to FIGS. 3a-3b, further illustrative embodiments will now be described in which a basic substrate material may be provided with enhanced thermal characteristics, thereby facilitating the formation of heat dissipation elements.

FIG. 3a schematically illustrates a cross-sectional view of a substrate 330, which may represent any appropriate base material for fabricating sophisticated semiconductor devices. The substrate 330 may comprise a front side 310F in and above which circuit elements, such as transistors and the like, will be formed, and may also comprise a back side 301B, which may be used as a thermal interface for finally connecting to an external cooling system, as previously explained. The substrate 330 may further comprise an active semiconductor layer 303, such as a silicon layer, a silicon/germanium layer and the like, as required for forming the circuit elements thereon and therein. Furthermore, in the embodiment shown, the substrate 330 may represent an SOI substrate comprising a buried insulating layer 302. In other cases, the buried insulating layer 302 may not be provided, if circuit elements are to be formed on the basis of a bulk architecture. Furthermore, a substrate material 301, such as silicon and the like, may be positioned below the active layer 303. Again, it should be appreciated that the thickness of the substrate material 301 may be significantly greater than the thickness of the active layer 303 and the buried insulating layer 302. In some illustrative embodiments, at least one heat spreading layer 331 may be formed in contact with the substrate material 301, for instance the layer 331 may be embedded in the material 301, so that a final layer 301A may be provided to represent the back side 301B. The layer 331 may comprise any appropriate thermally highly conductive material, such as carbon, specific semiconductor material of superior thermal conductivity, metals and the like. Consequently, by providing the layer 331 at a very early manufacturing stage, i.e., prior to actually forming any circuit elements, the process of providing the substrate 330 with enhanced heat dissipation capabilities may be completely decoupled from the manufacturing process for forming semiconductor devices. For instance, the substrate 330 may be provided as a base material and may be supplied to semiconductor facilities.

The substrate 330 may be formed, for instance, on the basis of wafer bond techniques, deposition processes and the like. For instance, the substrate material 301, possibly including the buried insulating layer 302, and the active semiconductor layer 303 may be formed on the basis of well-established techniques, followed by the deposition of an appropriate metal or any other material of enhanced thermal conductivity at the back side of the substrate material 301. Thereafter, if required, the layer 301A may be formed, for instance by deposition, wafer bond techniques and the like. Hence, in this state, the fabrication of heat dissipation elements may be simplified due to the presence of the heat spreading layer 331.

FIG. 3b schematically illustrates the substrate 330 in a further advanced manufacturing stage. As illustrated, a plurality of heat dissipation elements 330A may be provided so as extend from the active semiconductor layer 303 through the substrate material 301 and through or into the heat spreading layer 331. The heat dissipation elements 330A may be formed on the basis of manufacturing techniques as previously described, when provided by the manufacturer of circuit elements in accordance with a desired layout. However, due to the presence of the heat spreading layer 331, the overall manufacturing process may be simplified, since the layer 331 may be used as an etch stop layer for forming the corresponding openings, thereby providing enhanced overall patterning conditions. Also, the filling in of an appropriate material may be enhanced, for instance, in view of filling in a working fluid and the like, as previously explained. Consequently, a desired dense "grid" of the dissipation elements 330A may be formed at any appropriate manufacturing stage on the basis of superior process conditions. Furthermore, as indicated at the left hand side of FIG. 3b, the layer 301A may be maintained throughout the entire processing or, as illustrated, at the right hand side, the layer 331 may be exposed in accordance with any desired back side processing. For example, the layer 301A may be removed by CMP, if a corresponding back side configuration is considered appropriate. On the other hand, if desired, the layer 301A may be maintained throughout preceding process techniques, thereby providing a high degree of compatibility with the processing of conventional substrates. In still other illustrative embodiments, at least some of the heat dissipation elements 330A may be provided prior to forming any circuit elements, if high temperature stability of the elements 330A is sufficient. For example, a substrate manufacturer or any other user of the substrate 330 may provide some of the dissipation elements 330A on the basis of carbon material and the like, thereby ensuring a high degree of compatibility with any subsequent manufacturing processes for forming transistor elements. In this case, the elements 330A may be positioned so as to allow corresponding flexibility in designing the overall layout of specific semiconductor devices. In other cases, more or most of the heat dissipation elements 330A may be provided in a device specific manner, as previously described.

Figure 4:
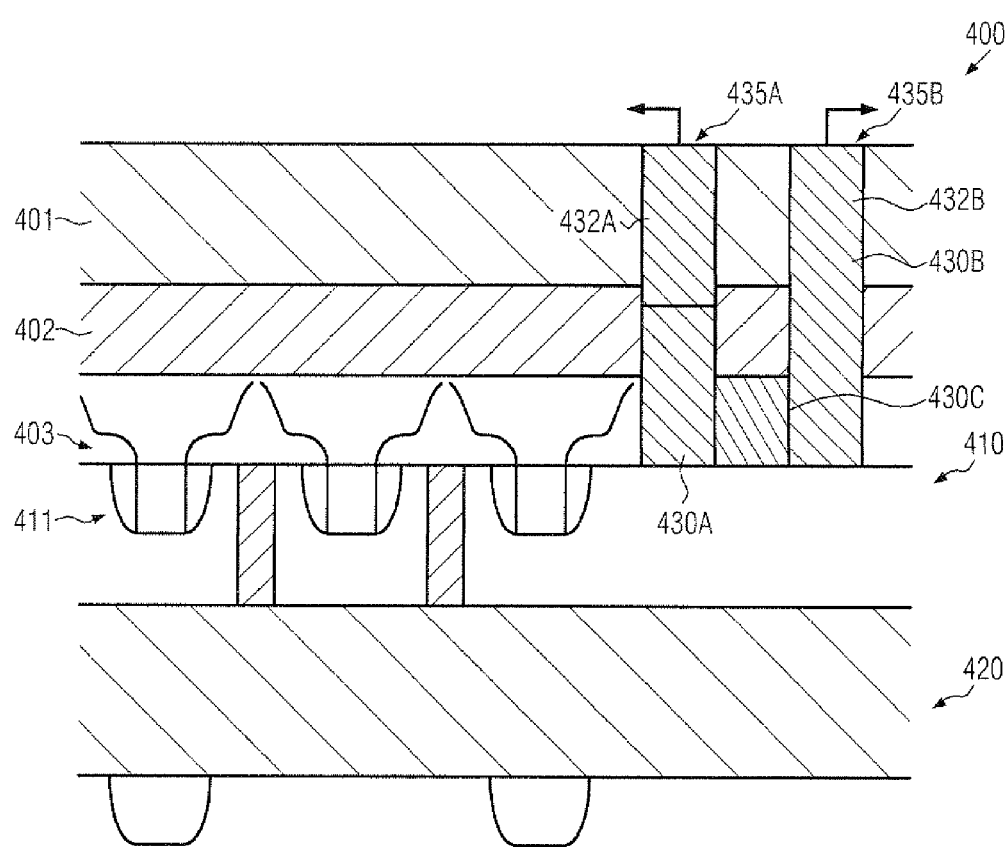
FIG. 4 schematically illustrates a cross-sectional view of a semiconductor device including heat dissipation elements, at least some of which may be provided in the form of a thermal couple, according to still further illustrative embodiments.

FIG. 4 schematically illustrates a semiconductor device 400 in which, in addition to superior heat dissipation capabilities, enhanced thermal monitoring or controlling capabilities may also be provided on the basis of appropriately configured heat dissipation elements. As illustrated, the semiconductor device 400 may comprise a device level 410 comprising circuit elements 411 formed in and above a semiconductor layer 403. Furthermore, a buried insulating layer 402 may be formed in contact with the layer 403, while, in other embodiments, the buried insulating layer 402 may be omitted. Furthermore, a substrate material 401 may be provided, such as a silicon material and the like. Moreover, a metallization system 420 may be provided and may be configured so as to enable contact to a package substrate or to a corresponding contact structure of a further semiconductor chip and the like. With respect to the components described so far, the same criteria may apply as previously described with reference to the semiconductor device 200. Moreover, a first heat dissipation element 430A may be provided so as to be in thermal contact with the device level 410 and may extend through the substrate material 401. Similarly, a second heat dissipation element 430B may be provided so as to thermally connect to the device level 410 and also extend through the substrate material 401. Furthermore, the heat dissipation elements 430A, 430B may be electrically in contact in the vicinity of the device level 410, thereby forming an interface 430C. Moreover, heat dissipation element 430A may comprise an electrically conductive material 432A, which may form, together with an electrically conductive fill material 432B of the element 430B, a thermo-electric element. It is well known that different conductors may create a voltage at an interface thereof depending on a temperature gradient between the corresponding interface and respective terminals of the different conductors. Consequently, since corresponding end portions 435A, 435B of the elements 430A, 430B may be in tight thermal contact with an external cooling system, while the interface 430C may be substantially at the high temperature generated in a contact level 410, a corresponding voltage may be created across the contacts 435A, 435B. The corresponding voltage may be used for monitoring purposes, for instance for actually assessing the temperature directly in the vicinity of temperature critical circuit elements, such as the transistors 411, thereby obtaining a highly reliable temperature dependent signal, which may also be readily supplied to any external temperature management systems. At the same time, the elements 430A, 430B may act as efficient heat dissipation elements. In other illustrative embodiments, a plurality of thermal electric elements, such as the combination of the elements 430A, 430B, may be provided and may be used for converting at least a portion of the waste heat into usable electric energy. For example, the thermal electric voltage may be supplied to an external voltage converter, which in turn may be coupled to a supply voltage source of the semiconductor device 400. In still other illustrative embodiments, the thermal electric elements comprised of the components 430A, 430B may even be used as an active cooling element by forcing a current flow, which may result in a cooling of the interface 430C, thereby even further enhancing the overall heat dissipation capabilities.

It should be appreciated that a plurality of appropriate materials are available and may be used as components for a corresponding thermo-electric pair of heat dissipation elements. For instance, copper in combination with constantan, i.e., a copper/tin alloy, may provide a pronounced temperature-related voltage. Also, other materials, including semiconductor materials and the like, may be used. If an increase of a corresponding temperature-related voltage may be required, a plurality of such thermal electric elements may be electrically connected in series, while being thermally connected in parallel, thereby providing the desired heat dissipation capabilities, while also enabling a voltage increase.

The heat dissipation elements 430A, 430B may be formed on the basis of process techniques as previously described, wherein, however, the filling in of the materials 432A, 432B may be performed in different steps so as to allow the deposition of different materials.

As a result, the present disclosure provides semiconductor devices, manufacturing techniques and substrates in which enhanced heat dissipation capabilities may be obtained on the basis of heat dissipation elements or heat pipes, which increase the transfer of thermal energy to an external cooling system, thereby allowing higher device densities, increased power ratings or reduced complexity of external cooling systems, while using standard manufacturing techniques that are well established. Consequently, extended product lifetime or superior performance with respect to heat management may be accomplished.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A semiconductor device, comprising:
a substrate comprising a front side and a back side;
one or more transistor elements formed in and above a semiconductor layer that is positioned above said front side;
a metallization system formed above said semiconductor layer;

a first heat dissipation element formed adjacent to said one or more transistor elements and extending into said substrate, said first heat dissipation element being electrically isolated from said one or more transistor elements, said semiconductor layer, and said metallization system and comprising a fill material having a thermal conductivity that is higher than a thermal conductivity of said semiconductor layer; and a second heat dissipation element formed adjacent to said one or more transistor elements, wherein said second heat dissipation element is electrically isolated from said semiconductor layer and from said first heat dissipation element within said substrate and wherein said second heat dissipation element is in electrical contact with said first heat dissipation element through an electrical interface located in said semiconductor layer.

2. The semiconductor device of claim 1, further comprising a buried insulating layer formed on said front side of said substrate, wherein said first heat dissipation element extends through said buried insulating layer.

3. The semiconductor device of claim 1, wherein said fill material comprises a metal.

4. The semiconductor device of claim 1, wherein at least one of said first and second heat dissipation elements extends to said back side of said substrate.

5. The semiconductor device of claim 1, wherein at least one of said first and second heat dissipation elements has a first lateral size at said semiconductor layer and has a second lateral size within said substrate and wherein said first lateral size is less than said second lateral size.

6. The semiconductor device of claim 1, wherein at least one of said first and second heat dissipation elements has a first lateral size at said semiconductor layer and has a second lateral size within said substrate and wherein said first lateral size is greater than said second lateral size.

7. The semiconductor device of claim 1, further comprising a heat spreading layer formed on said back side of said substrate, wherein at least one of said first and second heat dissipation elements is in contact with said heat spreading layer.

8. The semiconductor device of claim 7, wherein said at least one of said first and second heat dissipation elements extends at least partially through said heat spreading layer.

9. The semiconductor device of claim 1, wherein said one or more transistor elements represent circuit elements of a speed critical logic circuit portion.

10. The semiconductor device of claim 1, wherein said second heat dissipation element comprises a second fill material that is in contact with said fill material of said first heat dissipation element at said electrical interface.

11. The semiconductor device of claim 10, wherein said fill material of said first heat dissipation element is different than said second fill material of said second heat dissipation element, said first and second heat dissipation elements forming a thermo-electric element.

12. A semiconductor device, comprising:
a substrate comprising a front side and a back side;
one or more transistor elements formed in and above a semiconductor layer that is positioned above said front side;
a metallization system formed above said semiconductor layer; and
a heat dissipation element formed adjacent to said one or more transistor elements and extending into said substrate, said heat dissipation element being electrically isolated from said one or more transistor elements and said metallization system and comprising a fill material having a thermal conductivity that is higher than a thermal conductivity of said semiconductor layer, and wherein said fill material comprises a fluid.

13. The semiconductor device of claim 12, further comprising at least one plug for confining said fluid, wherein said plug is comprised of a material that has a higher thermal conductivity compared to said semiconductor layer.

14. The semiconductor device of claim 12, further comprising at least one further heat dissipation element formed adjacent to said one or more transistor elements, wherein said at least one further heat dissipation element is isolated from said first heat dissipation element within said substrate and is in contact with said first heat dissipation element at said semiconductor layer.

15. A substrate for forming semiconductor devices, said substrate comprising:
a semiconductor layer positioned above a front side of a substrate material so as to define a front side surface of said substrate;
a heat spreading layer positioned below and in contact with a back side of said substrate material so as to define a back side surface of said substrate, said heat spreading layer having a thermal conductivity that is greater than a thermal conductivity of said substrate material and greater than a thermal conductivity of said semiconductor layer, wherein the heat spreading layer is electrically isolated from the semiconductor layer; and
a plurality of heat dissipation elements, each of said plurality of heat dissipation elements extending through said semiconductor layer, said substrate material, and at least a portion of said heat spreading layer.

16. The substrate of claim 15, wherein said heat spreading layer comprises a metal.

17. The substrate of claim 15, further comprising a buried insulating layer formed between said semiconductor layer and said substrate material.

18. The substrate of claim 15, wherein said semiconductor layer and said substrate material comprise silicon.

19. The substrate of claim 15, further comprising a material layer covering at least a portion of said heat spreading layer defining said back side surface of said substrate.

20. The substrate of claim 15, wherein each of said plurality of heat dissipation elements extends from said front side surface of said substrate to said back side surface of said substrate.

* * * * *